United States Patent [19]
Kuwamura

[11] 3,887,912
[45] June 3, 1975

[54] ANALOGUE-DIGITAL CONVERTER APPARATUS

[75] Inventor: Mitomu Kuwamura, Tokyo, Japan

[73] Assignee: Iwatsu Electric Company, Japan

[22] Filed: Oct. 15, 1973

[21] Appl. No.: 406,462

[30] Foreign Application Priority Data

Oct. 20, 1972 Japan .............................. 47-10563

[52] U.S. Cl. .............................................. 340/347
[51] Int. Cl. .......................................... H03k 13/17
[58] Field of Search ............................. 340/347 AD

[56] References Cited

UNITED STATES PATENTS

| | | | |
|---|---|---|---|
| 3,050,713 | 8/1962 | Harmon | 340/172 |
| 3,216,005 | 11/1965 | Hoffman et al. | 340/347 |
| 3,225,347 | 12/1965 | Doyle | 340/347 |
| 3,537,101 | 10/1970 | Campanella et al. | 340/347 |
| 3,544,779 | 12/1970 | Farrow | 235/155 |
| 3,573,798 | 4/1971 | Reiling | 340/347 |
| 3,585,635 | 6/1971 | Reiling | 340/347 |
| 3,646,548 | 1/1971 | VanDoren | 340/347 AD |

*Primary Examiner*—Malcolm A. Morrison
*Assistant Examiner*—Vincent J. Sunderdick
*Attorney, Agent, or Firm*—Oblon, Fisher, Spivak, McClelland & Maier

[57] ABSTRACT

The apparatus comprises a plurality of analogue-digital converters of the same number as the number of bits (*m*) of the digital output, a plurality of delay elements coupled to respective converters to successively apply the analogue input to the analogue-digital converters starting from the converter corresponding to the most significant digit with a predetermined time delay between the inputs to adjacent converters, a plurality of shift registers which store the outputs from respective analogue-digital converters and successively shift the stored outputs, weight resistors controlled in accordance with the contents of the shift registers for supplying reference voltages of different values successively to the analogue-digital converters starting from the converter corresponding to the most significant digit, and memory means for storing the outputs from the analogue-digital converters and for producing a digital output corresponding to the analogue input.

3 Claims, 7 Drawing Figures

ANALOGUE-DIGITAL CONVERTER APPARATUS

BACKGROUND OF THE INVENTION

This invention relates to a novel analogue-digital converter.

Among prior art high speed analogue-digital converters are included a parallel type analogue-digital converter and consecutively comparing type analogue-digital converter. In the parallel type analogue-digital converter, if the resolution is improved, that is if the number of bits is increased, the circuit becomes bulky, complicated and expensive. Further, mounting a large circuit on a plane limits the speed of operation. The block connection diagram of the consecutively comparing type analogue-digital converter is shown in FIG. 1 of the accompanying drawing in which an input voltage Vx impressed upon an input terminal 1 is consecutively compared with a plurality of reference voltages $2^{m-1}$, $2^{m-2}$ . . . $2^0$ by means of a comparator 2 where $m$ represents the number of bits of a binary code to be converted. The output from the comparator 2 is applied to a digital output circuit 4 through a pulse shaping circuit 3. The digital output circuit 4 stores digital values and produces digital outputs across output terminals 7. Any suitable combinations of the reference voltages $2^{m-1}$, $2^{m-2}$ . . . $2^0$ are sequentially sent out from a reference voltage generator 5 under the control of a shift signal impressed upon an input terminal 6.

The analogue-digital converter shown in FIG. 1 operates as follows: First, the analogue input voltage Vx is compared with the reference voltage $2^{m-1}$ in the comparator 2 where Vx < Vs (Vs represents the reference voltage), a "0" is stored in the first stage of the digital output circuit 4 and the reference voltage generator 5 is shifted to send out the reference voltage $2^{m-2}$ to the comparator 2 instead of reference voltage $2^{m-1}$. On the other hand, where Vx > Vs, an "1" is stored in the first stage of the digital output circuit 4 and the reference voltage generator 5 is shifted to apply the reference voltage $(2^{m-1} + 2^{m-2})$ to the comparator.

In this manner, the operation of comparing the analogue input voltage Vx with the sums of reference voltage $2^{m-1}$ of the highest digit and reference voltages of lower digits is repeated until the least significant digit is reached, and the contents of the digital output circuit 4 is read out, thus converting analogue input into a digital output. Under these conditions, the conversion time of the digital-analogue converter is equal to the product of the time required to discriminate one bit and the number of bits. Accordingly, it is necessary to reduce the conversion time for one bit in order to increase the conversion speed. In other words, it is necessary to decrease the time required for comparison and the time required for producing the reference voltages of lower orders from the reference voltage generator.

For this reason, even a comparator operating at the highest speed at present requires a comparison time of several nanoseconds as well as a conversion time of several nanoseconds. Thus, the operating speed of the analogue-digital converter is limited.

SUMMARY OF THE INVENTION

Accordingly, it is an object of this invention to provide an improved analogue-digital converter capable of operating at a high speed.

In view of the fact that the comparison speed of the comparator is limited as described hereinabove, according to this invention, without feeding back the result of comparison of the comparator as in the prior art sequentially comparing type analogue-digital converter, a plurality of comparators and weight circuits, each of the number equal to the number of bits, are used, different currents are passed through respective weight circuits, so that an input signal is applied successively to respective comparators starting from the converter corresponding to the most significant digit toward the converter corresponding to the least significant digit with a time delay between adjacent converters which corresponds to the sum of the time required for the comparator to make comparison and the switching time of the weight circuits, the results of the comparisons of respective comparators are stored in a shift register, and the weight circuits are rendered operative and inoperative according to the content of the shift register. With this arrangement, it is possible to reduce the conversion time required by the analogue-digital converter to the time required by each comparator for performing comparison thus increasing the operating speed of the analogue-digital converter.

Briefly stated, the analogue-digital converter apparatus of this invention comprises a plurality of analogue-digital converters of the same number as the number of bits ($m$) of the digital output, each of said analogue-digital converters acting to convert an analogue input into a digital output, a plurality of delay elements coupled to respective converters to successively apply the analogue input to the analogue-digital converters starting from the converter corresponding to the most significant digit toward the converter corresponding to the least significant digit with a predetermined time delay between the inputs to adjacent converters, a plurality of shift registers connected to receive and set respective outputs from the plurality of analogue-digital converters and to receive a shift pulse having a period equal to the predetermined delay time for successively shifting the outputs set in the shift registers, weight circuit means connected to be controlled in accordance with the contents of the shift registers for supplying reference outputs successively to the analogue-digital converters starting from the converter corresponding to the most significant digit toward the converter corresponding to the least significant digit, the reference outputs being the combinations of $2^{m-1}$, $2^{m-2}$ . . . $2^0$, where $m$ has the same meaning as above defined, and memory means for storing the outputs from the analogue-digital converters and for producing a digital output corresponding to the analogue input.

BRIEF DESCRIPTION OF THE DRAWINGS

Further objects and advantages of the invention can be more fully understood from the following detailed description taken in conjunction with the accompanying drawings in which.

DESCRIPTION OF THE PREFERRED EMBODIMENT

Figure 1:
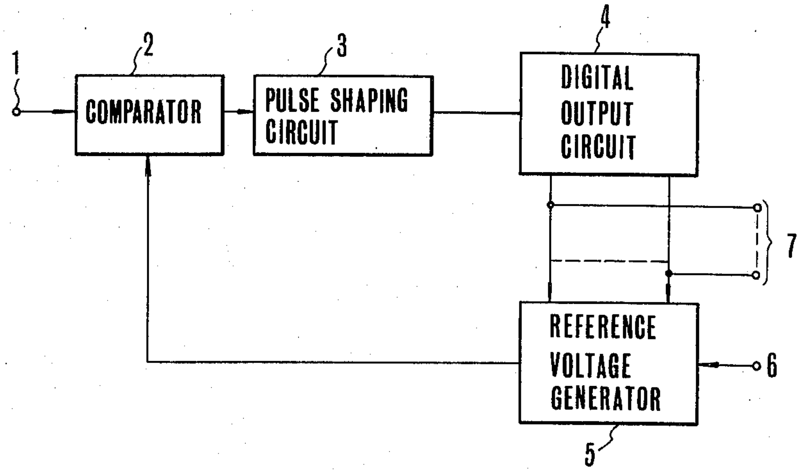
FIG. 1 PRIOR ART
FIG. 1 shows a block diagram of a prior art analogue-digital converter.
Figure 3:
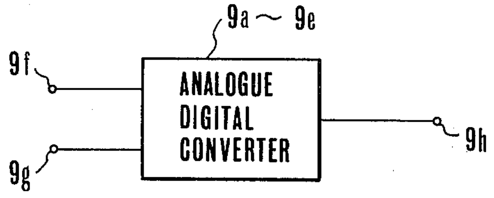
FIG. 3 is a block diagram showing the comparator utilized in the circuit shown in FIG. 2.
Figure 4:
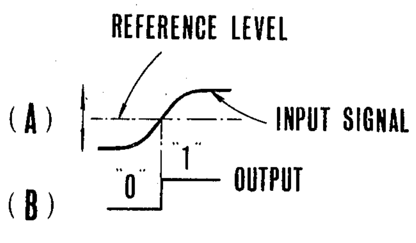
FIG. 4 shows waveforms utilized to explain the operation of the comparator shown in FIG. 3.
Figure 2:
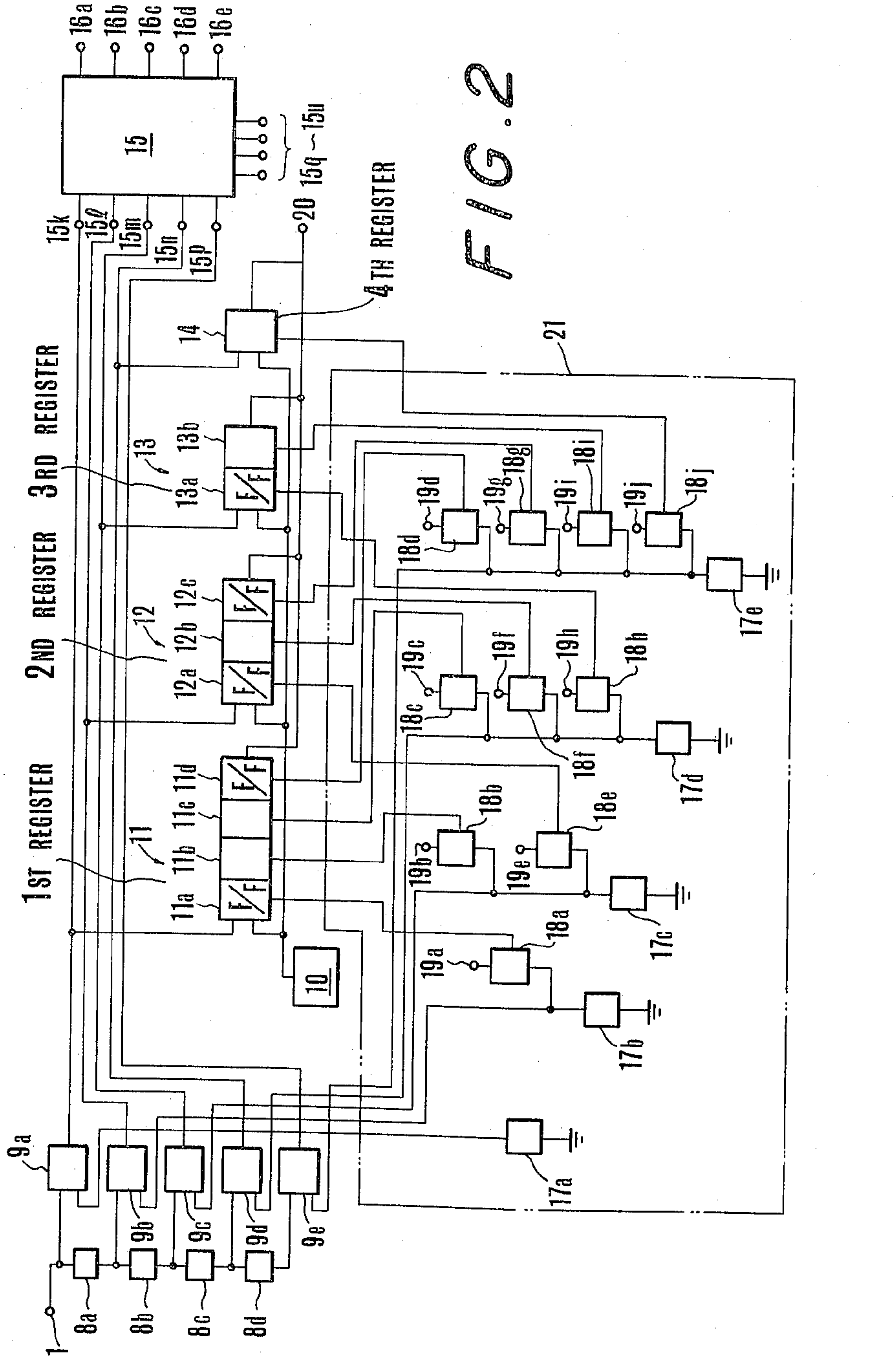
FIG. 2 is a block diagram illustrating one embodiment of the novel analogue-digital converter embodying the invention.
Figure 5:
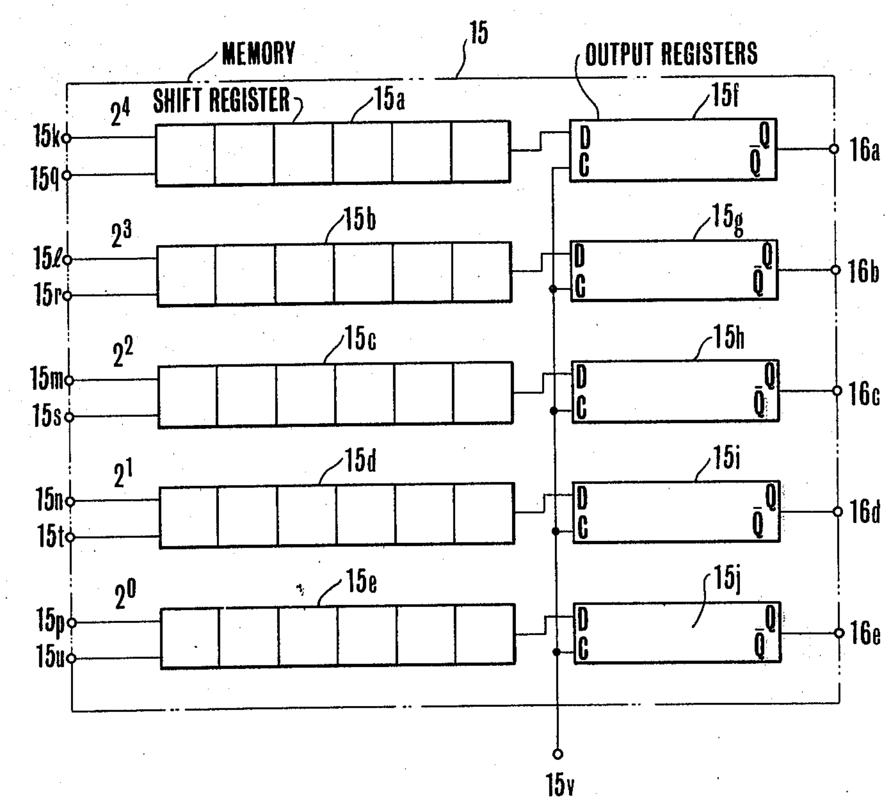
FIG. 5 is a block diagram showing the detail of the memory circuit shown in FIG. 2.
Figure 6:
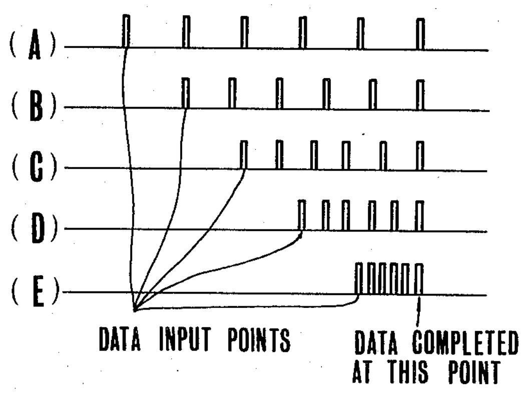
FIG. 6 shows waveforms useful to explain the operation of the memory circuit shown in FIG. 5.
Figure 7:
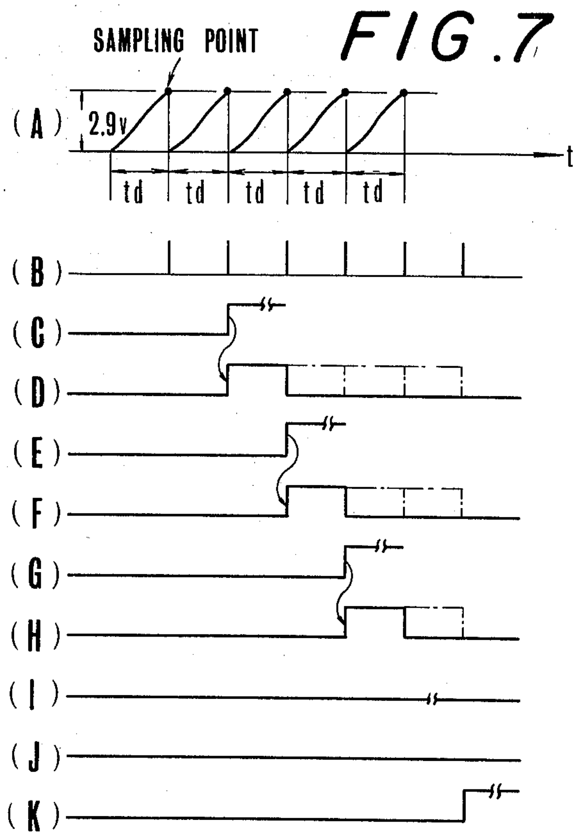
FIG. 7 shows waveforms useful to explain the operation of the embodiment shown in FIG. 2.

A preferred embodiment of this invention shown in FIG. 2 comprises a plurality of delay circuits 8*a* through 8*d* each having a delay time of *td*, and a plurality of analogue-digital converters 9*a* through 9*e* each having an analogue input terminal 9*f* connected to the delay circuit, a reference voltage input terminal 9*g* and a digital output terminal 9*h* as shown in FIG. 3. Reference voltages applied to these analogue-digital converters are 1.6 V for the converter 9*a* corresponding to the most significant bit, 0.8 V for converter 9*b*, 0.4 V for converter 9*c*, 0.2 V for converter 9*d* and 0.1 V for the converter 9*e* corresponding to the least significant bit, respectively. There are also provided a pulse generator 10 which sends out a pulse (see FIG. 7 B) at a period corresponding to the delay time td of the delay circuits 8*a* through 8*d*, a first four bit register 11 comprising four flip-flop circuits 11*a* through 11*d*, a second three bit shift register 12 comprising three flip-flop circuits 12*a*, 12*b* and 12*c*, a third two bit shift register 13 comprising two flip-flop circuits, a fourth shift register comprising a single flip-flop circuit and a memory circuit 15 comprising a 5 bit memory shift registers 15*a* through 15*e* each made up of 6 flip-flop circuits and a 5 bit output register made up of five flip-flop circuits 15*f* through 15*j*, as shown in FIG. 5. The operation of the memory circuit 15 will be described later in detail with reference to FIG. 6. The memory circuit 15 is provided with output terminals 16*a* through 16*e* for 5 bit digital outputs, for example. Associated with analogue-digital converters 9*a* through 9*e* are weight resistors 17*a* through 17*e* having resistance values of 1600 ohms, 800 ohms, 400 ohms, 200 ohms and 100 ohms respectively, and passing a current of 1 mA respectively. Sources of constant current 18*a* through 18*j* respectively provided with source terminals 19*a* through 19*j* are associated with the first to fourth shift registers 11 to 14. The sources of constant current are made operative when the flip-flop circuits of the first to fourth shift registers assume a state of "1". The source 18*a* supplies a constant current of 2 mA while sources 18*b* through 18*j* supply constant currents of 4 mA, 8 mA, 16 mA, 2 mA, 4 mA, 8 mA, 2 mA, 4 mA and 2 mA, respectively. A reset terminal 20 is connected to the first to fourth shift registers for applying thereto a reset pulse for setting the contents of these registers to "0".

Each analogue-digital converter shown in FIG. 3 is applied with an input signal to the input terminal 9*f* and a reference voltage to the reference voltage input terminal 9*g*, and the level of the output appearing at the output terminal 9*h* changes from "0" level to "1" level whenever the input signal exceeds the reference voltage.

As shown in FIG. 5 the memory circuit 15 is provided with input terminals 15*k* to 15*p*, and first clock terminals 15*q* to 15*u* for the memory shift registers 15*a* to 15*e* which are connected to receive pulses shown in FIGS. 6A through 6E and a second clock terminal 15*v* for the output shift registers 15*f* through 15*j*.

The weight resistors 17*a* through 17*e* cooperate with the sources of constant current 18*a* through 18*j* to form a weight circuit 21 for sending out reference outputs comprising suitable combinations of $2^{m-1}$, $2^{m-2}$ . . . $2^0$.

The analogue-digital converter shown in FIG. 2 operates as follows. Before the analogue to digital conversion, a reset pulse is applied to the reset terminal 20 for resetting first to fourth shift registers 11 – 14. Thus the sources of constant current 18*a* through 18*j* connected to these shift registers are rendered nooperative.

Suppose now that the analogue voltage impressed upon input terminal 1 has a value of 2.9 V, for example (see FIG. 7A). Since the reference voltage applied to the analogue-digital converter 9*a* has a value of 1.6 V, the output of this converter assumes a level "1" as shown in FIG. 7C. The digital output is delayed by an interval td with respect to the analogue input which means that the converter 9*a* requires the interval td for comparison. The "1" output from converter 9*a* is applied to an input terminal 15*k* of the memory circuit 15 to be stored in the first stage thereof. Further, this output is set in the flip-flop circuit 11*a* of the first shift register 11 as shown in FIG. 7D. As a result of the setting of the flip-flop circuit 11*a*, the source of constant current 18*a* is rendered operative. Accordingly, a current of 2 mA from the source of constant current 18*a* is added to the current of 1 mA which has been flowing through the weight resistor 17*b*, thus forming a current of 3 mA. Because, the weight resistor 17*b* has a value of 800 ohms, a voltage of 2.4 V will be produced across the opposite terminals of the weight resistor 17*b*. This reference voltage of 2.4 V is applied to the analogue-digital converter 9*b*. As a result, the analogue input voltage (2.9 V) delayed by *td* by the delay circuit 8*a* is compared with the reference voltage. Accordingly, the output of the analogue-digital converter 9*b* assumes an "1" level as shown in FIG. 7E. This "1" output from converter 9*b* is stored in the first stage of register 15*b* of the memory circuit 15 via its input terminal 15l and is also set in the flip-flop circuit 12*a* of the second shift register 12, as shown in FIG. 7F. At this time, the "1" signal which has been stored in the flip-flop circuit 11*a* of the first shift register 11 will be shifted to the flip-flop circuit 11*b*.

In this manner, since both flip-flop circuits 11*b* and 12*a* assume "1" state both sources of constant currents 18*b* and 18*e* are rendered operative with the result that the current of 4 mA from the source of constant current 18*b* and the current of 2 mA from the source of constant current 18*e* are added to 1 mA which has been flowing through the weight resistor 17c thus passing a total of 7 mA. Since the weight resistor 17*c* has a resistance of 400 ohms, a voltage of 2.8 V will be created across the terminals of the weight resistor 17*c*. Thus, this reference voltage of 2.8 V is impressed upon the analogue-digital converter 9*c*, and the analogue input voltage (2.9 V) further delayed by an interval *td* by the action of the delay circuit 8*b* is compared with this reference voltage of 2.8 V. Accordingly, the output from analogue-digital converter 9*c* assumes an "1" state as shown in FIG. 7G which is stored in the first stage of register 15*c* of the memory circuit 15 through its input terminal 15*m* and is set in the flip-flop circuit 13*a* of the third shift register 13. Concurrently therewith, the "1" signal which has been stored in the flip-flop circuit 11*b* of the first shift register will be shifted into the flip-flop circuit 11*c* whereas the "1" signal which has been stored in the flip-flop circuit 12*a* of the second shift register 12 will be shifted into the flip-flop circuit 12*b*.

In this manner, all flip-flop circuits 11*c*, 12*b* and 13*a* assume "1" state so that three sources of constant current 18*c*, 18*f* and 18*h* are rendered operative with the result that currents of 8 mA, 4 mA and 2 mA respectively from the sources of constant current 18*e*, 18*f* and 18*h* are added to a current of 1 mA which has been flowing through the weight resistor 17*d* thus increasing the current to 15 mA. Because the weight resistor 17*d* has a value of 200 ohms, a voltage of 3.0 V appears across the opposite terminals of the weight resistor 17*d* and this reference voltage of 3.0 V is applied to the analogue-digital converter 9*d*. Consequently, the input analogue voltage (2.9 V) further delayed by *td* by the action of the delay circuit 8*c* is compared with the reference voltage of 3.0 V. As a result, the output from the analogue-digital converter 9*d* assumes a "0" state as shown in FIG. 7I, and this "0" output is stored in the first stage of the register 15*d* of the memory circuit 15 through its input terminal 15*n* and is also set in the fourth shift register 14 as shown in FIG. 7J.

Then, the signal "1" which has been stored in the flip-flop circuit 11*c* of the first shift register 11 is shifted to the flip-flop circuit 11*d*, the signal "1" which has been stored in the flip-flop circuit 12*b* of the second shift register 12 is shifted to the flip-flop circuit 12*c* of the same shift register and the signal "1" which has been stored in the flip-flop circuit 13*a* in the third shift register 13 is shifted to the flip-flop circuit 13*b* of the same shift register.

In this manner, since all flip-flop circuits 11*d*, 12*c* and 13*b* contain "1" signal, sources of constant current 18*d*, 18*g* and 18*i* are rendered operative so that the sum of 1 mA, 16 mA from source 18*d*, 8 mA from source 18*g* and 4 mA from source 18*i*, that is 29 mA will flow through the weight resister 17*e* as the weight resistor 17*e* has a resistance value of 100 ohms, a voltage of 2.9 V appears across its opposite terminals. Consequently, this reference voltage of 2.9 V is impressed upon the analogue-digital converter 9*e* and the analogue voltage (2.9 V) which has been delayed further by *td* by the action of the delay circuit 8*d* is compared with this reference voltage of 2.9 V. Under these circumstances whether the analogue-digital converter 9*e* provides an output "1" or "0", for the purpose of description, if it is assumed now that the analogue-digital converter 9*e* provides an output "1" as shown in FIG. 7K, this "1" output is stored in the register 15*e* of the memory circuit 15 through its input terminal 15*p*. Thus, a digital code 1, 1, 1, 0, 1 is stored in the memory circuit.

As can be noted from FIGS. 7A through 7K, the data applied to the input terminals of the registers of the memory circuit 15 arrive in the order starting from the most significant digit to the least significant digit with a delay time td between adjacent digits as shown in FIGS. 6A through 6E. Accordingly, by shifting 6 times the data and by applying a clock pulse to the first clock terminals of respective shift registers 15*a* through 15*e* of the memory circuit 15, the data is completed. When a clock pulse is applied to the second clock terminal 15*u*, this pulse is set in the output shift registers 15*f* to 15*j* thus producing a digital output on the output terminals 16*a* through 16*e*.

The time required for the data of respective bits to become complete is termed a waiting time.

Although above description relates to an example processing an analogue input voltage up to 3.1 V, it will be clear that analogue input voltages of any desired magnitude can be processed by varying the number, capacity or both of the registers 11, 12 and 13, the registers of the memory circuit 15 and the weight circuits.

As has been described in detail, in the high speed analogue-digital converter of this invention, the respective bits of the input signal are delayed by an interval of time which is equal to the time required for the comparator for making a comparison so that respective bits are consecutively compared and converted with a period equal to the delay time. Thus, the conversion time of the novel analog-digital converter is equal to the time required for the comparator for making a comparison or judgement, that is the delay time td of the delay circuit. Thus, if *td* = 10 nanoseconds, for example, an interval of 50 nanoseconds is necessary to complete a data of one words consisting of 5 bits. However, a sampling rate of 10 nanoseconds can be realized thereby providing a high speed analogue-digital converter by increasing the capacity of the memory circuit so as to store and read out the data by utilizing the full capacity of the memory.

Although the invention has been shown and described in terms of a preferred embodiment thereof, it will be clear that many changes and modifications will be obvious to one skilled in the art without departing the scope of the invention as defined in the appended claims.

What is claimed is:

1. An analogue-digital converter apparatus comprising a plurality of analogue-digital converters of the same number as the number of bits ($m$) of the digital output, each of said analogue-digital converters acting to convert an analogue input into a digital output, a plurality of delay elements coupled to respective converters to successively apply said analogue input to said analogue-digital converters starting from the converter corresponding to the most significant digit toward the converter corresponding to the least significant digit with a predetermined time delay between the inputs to adjacent converters, a plurality of shift registers connected to receive and set respective outputs from said plurality of analogue-digital converters and to receive a shift pulse having a period equal to said predetermined delay time for successively shifting said outputs set in said shift registers, weight circuit means connected to be controlled in accordance with the contents of said shift registers for supplying reference outputs successively to said analogue-digital converters starting from the converter corresponding to the most significant digit toward the converter corresponding to the least significant digit, said reference outputs being the combinations of $2^{m-1}$, $2^{m-2}$ . . . $2^0$ where $m$ has the same meaning as above defined, and memory means for storing the outputs from said analogue-digital converters and for producing a digital output corresponding to said analogue input.

2. The analogue-digital converter apparatus according to claim 1 wherein said weight circuit means comprises a plurality of weight resistors having different values and connected to said analogue-digital converters respectively, a plurality of sources of different constant currents associated with said weight resistors and means responsive to the contents of said shift registers for enabling said sources of constant currents for passing currents of predetermined values through said weight resisters for producing reference voltages of different values.

3. The analogue-digital converter apparatus according to claim 1 which further comprises a pulse generator which supplies to said shift registers a shift pulse having a period equal to the delay time of said delay elements.

* * * * *